US011513386B2

(12) United States Patent
Ren

(10) Patent No.: US 11,513,386 B2
(45) Date of Patent: Nov. 29, 2022

(54) COLOR FILTER AND MANUFACTURING METHOD THEREOF, AND DISPLAY DEVICE

(71) Applicant: Shenzhen China Star Optoelectronics Semiconductor Display Technology Co., Ltd., Shenzhen (CN)

(72) Inventor: Wei Ren, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 371 days.

(21) Appl. No.: 16/626,543

(22) PCT Filed: Dec. 18, 2019

(86) PCT No.: PCT/CN2019/126207
§ 371 (c)(1),
(2) Date: Dec. 25, 2019

(87) PCT Pub. No.: WO2021/109250
PCT Pub. Date: Jun. 10, 2021

(65) Prior Publication Data
US 2021/0333623 A1 Oct. 28, 2021

(30) Foreign Application Priority Data
Dec. 2, 2019 (CN) .......................... 201911214386.5

(51) Int. Cl.
*G02F 1/1335* (2006.01)
*G02B 5/20* (2006.01)
(Continued)

(52) U.S. Cl.
CPC ....... *G02F 1/133516* (2013.01); *G02B 5/201* (2013.01); *G02F 1/133351* (2013.01);
(Continued)

(58) Field of Classification Search
CPC ......... G02F 1/133351; G02F 1/133512; G02F 1/133357; G02F 1/13439; G02F 1/133514;
(Continued)

(56) References Cited

U.S. PATENT DOCUMENTS

2002/0197421 A1* 12/2002 Yamazaki ............. G02F 1/1333
83/13
2004/0119903 A1* 6/2004 Chang ............... G02F 1/133516
349/43
(Continued)

FOREIGN PATENT DOCUMENTS

CN 103995385 8/2014
CN 108490674 9/2018
(Continued)

*Primary Examiner* — Michael H Caley
*Assistant Examiner* — Jonathan Y Jung
(74) *Attorney, Agent, or Firm* — PV IP PC; Wei Te Chung; Ude Lu

(57) ABSTRACT

A color filter and a manufacturing method thereof, and a display device are provided. The color filter includes a color filter substrate, a plurality of sub-pixel regions, wherein each of the sub-pixel regions includes a first signal region, a second signal region, and a laser path disposed between the first signal region and the second signal region, a first light-shielding sheet disposed on the first signal region and covered with a first indium tin oxide layer, and a second light-shielding sheet disposed on the second signal region and covered with a second indium tin oxide layer. Wherein, the first signal region receives signals through the first indium tin oxide layer, and the second signal region receives signals through the second indium tin oxide layer, therefore improving the problem of signal transmission delay caused by the regional signal impedance difference of the indium tin oxide layer.

14 Claims, 3 Drawing Sheets

(51) Int. Cl.
*G02F 1/1333* (2006.01)
*H05K 3/00* (2006.01)

(52) U.S. Cl.
CPC ..... *G02F 1/133512* (2013.01); *H05K 3/0026* (2013.01); *G02F 1/133357* (2021.01); *H05K 2203/107* (2013.01)

(58) Field of Classification Search
CPC ........... H05K 2203/107; H05K 3/0026; B41M 5/265
See application file for complete search history.

(56) References Cited

U.S. PATENT DOCUMENTS

| | | | |
|---|---|---|---|
| 2004/0209410 A1* | 10/2004 | Tanaka | H01L 21/02425 257/E27.111 |
| 2007/0216834 A1 | 9/2007 | Hsu et al. | |
| 2007/0229735 A1* | 10/2007 | Lee | G02F 1/133512 349/106 |
| 2007/0289768 A1* | 12/2007 | Moore | G02F 1/13334 174/98 |
| 2015/0219948 A1* | 8/2015 | Kamimura | G06F 3/04166 349/12 |
| 2019/0079322 A1* | 3/2019 | Feng | G02F 1/1337 |
| 2019/0293991 A1* | 9/2019 | Yonebayashi | G02F 1/133602 |

FOREIGN PATENT DOCUMENTS

| | | |
|---|---|---|
| CN | 108873422 | 11/2018 |
| CN | 109212850 | 1/2019 |

\* cited by examiner

COLOR FILTER AND MANUFACTURING METHOD THEREOF, AND DISPLAY DEVICE

RELATED APPLICATIONS

This application is a National Phase of PCT Patent Application No. PCT/CN2019/126207 having International filing date of Dec. 18, 2019, which claims the benefit of priority of Chinese Patent Application No. 201911214386.5 filed on Dec. 2, 2019. The contents of the above applications are all incorporated by reference as if fully set forth herein in their entirety.

FIELD AND BACKGROUND OF THE INVENTION

The present disclosure relates to the field of display technologies, and more particularly to a color filter, a manufacturing method thereof, and a display device.

With the rapid development of liquid crystal display (LCD) devices, the need for multi-chip simultaneously curing technology on a side of a color filter (CF) is increasingly urgent. In the prior art, by lasering an indium tin oxide (ITO) layer on the color filter (CF) side, the product is divided into sections and then electrically cured. Please refer to FIG. 1, FIG. 1 shows a schematic diagram of lasering an indium tin oxide layer on a color filter in the prior art. By lasering the indium tin oxide layer CF ITO on the color filter side along the laser cutting line L1, and dividing the indium tin oxide layer CF ITO on the color filter side into an L region and an H region, so that a low-voltage signal L and a high-voltage signal H are input to the L region and the H region, respectively.

A region of the laser cutting path and a divided area are limited by a layout of a black matrix (BM) and a size of the vacant region between the chips. Please refer to FIG. 2, FIG. 2 shows a schematic diagram of lasering damaging a light shielding film. When the laser 10 is output to the light-shielding film 20, this not only destroys the integrity of the light-shielding film causing light leakage, but also affects the conductivity of the indium tin oxide layer.

In addition, in the prior art, a region of a high electrical potential signal ITO region is large, which is only limited by the layout restrictions of the peripheral dummy space area. However, a region of the low electrical potential signal ITO region is small and the signal impedance is relatively large, affecting the signal transmission speed and easily causing delay. For details, please refer to FIG. 3. FIG. 3 shows a schematic diagram of the distribution of the high electrical potential signal ITO region H and the low electrical potential signal ITO region L in the prior art.

Therefore, there is a need to provide a color filter, a manufacturing method thereof, and a display device to solve the problems in the prior art.

SUMMARY OF THE INVENTION

In order to solve the above problems, the present disclosure provides a color filter, a manufacturing method thereof, and a display device, to improve the signal delay problem caused by the difference of regional signal impedance of the indium tin oxide layer.

To achieve the above object, the present disclosure provides a color filter including: a color filter substrate, a plurality of sub-pixel regions, wherein each of the sub-pixel regions includes a first signal region, a second signal region, and a laser path disposed between the first signal region and the second signal region; a first light-shielding sheet disposed on the first signal region, and covered with a first indium tin oxide layer; and a second light-shielding sheet disposed on the second signal region, and covered with a second indium tin oxide layer; wherein the first signal region receives signals through the first indium tin oxide layer, and the second signal region receives signals through the second indium tin oxide layer.

In one embodiment of the present disclosure, a path width of the laser path is greater than 450 μm.

In an embodiment of the present disclosure, a region of the first light-shielding sheet is less than a region of the second light-shielding sheet, the first signal region receives a low-voltage signal through the first indium tin oxide layer, and the second signal region receives a high-voltage signal through the second indium tin oxide layer.

In one embodiment of the present disclosure, a region of the first signal region is less than a region of the second signal region, the first signal region receives a low-voltage signal through the first indium tin oxide layer, and the second signal region receives a high-voltage signal through the second indium tin oxide layer.

In order to achieve the above object, the present disclosure further provides a method of manufacturing a color filter, including: forming a substrate, wherein the substrate includes a plurality of sub-pixel regions; forming a first light-shielding sheet and a second light-shielding sheet in each of the sub-pixel regions of the substrate; forming an indium tin oxide layer on the first light-shielding sheet and the second light-shielding sheet; and lasering the indium tin oxide layer to form a laser path; wherein the laser path separates the indium tin oxide layer into a first indium tin oxide layer covering the first light-shielding sheet, and a second indium tin oxide layer covering the second light-shielding sheet; and separates the sub-pixel region into a first signal region comprising the first light-shielding sheet and first indium tin oxide layer, and a second signal region including the second light-shielding sheet and the second indium tin oxide layer.

In one embodiment of the present disclosure, a path width of the laser path is greater than 450 μm.

In an embodiment of the present disclosure, a region of the first light-shielding sheet is less than a region of the second light-shielding sheet, the first signal region receives a low-voltage signal through the first indium tin oxide layer, and the second signal region receives a high-voltage signal through the second indium tin oxide layer.

To achieve the above object, the present disclosure further provides a display device, including: a first substrate; a plurality of metal layers disposed on the first substrate; a passivation layer covering the first substrate and the plurality of metal layers; a plurality of color resists disposed on the passivation layer; a planarization layer covering the plurality of color resists and the passivation layer; a color filter substrate disposed on another side opposite to the first substrate; a plurality of sub-pixel regions disposed under the color filter substrate, wherein each of the sub-pixel regions includes a first signal region, a second signal region, and a laser path disposed between the first signal region and the second signal region; a first light-shielding sheet disposed on the first signal region, and covered with a first indium tin oxide layer; and a second light-shielding sheet disposed on the second signal region, and covered with a second indium tin oxide layer; and a spacer layer including a first surface and a second surface, wherein the first surface contacts the planarization layer, and the second surface contacts the first indium tin oxide layer and the second indium tin oxide layer;

wherein the first signal region receives signals through the first indium tin oxide layer, and the second signal region receives signals through the second indium tin oxide layer, disposing positions of the plurality of color resists are aligned below a disposing position of the laser path.

In an embodiment of the present disclosure, a region of the first light-shielding sheet is less than a region of the second light-shielding sheet, the first signal region receives a low-voltage signal through the first indium tin oxide layer, and the second signal region receives a high-voltage signal through the second indium tin oxide layer.

In an embodiment of the present disclosure, the plurality of color resists are stacked on the passivation layer, and a width of an overlapping portion of the plurality of color resists is greater than a width of the laser path.

Compared with the prior art, the present disclosure provides a color filter and a manufacturing method thereof, and a display device, wherein the color filter includes a color filter substrate, a plurality of sub-pixel regions, wherein each of the sub-pixel regions includes a first signal region, a second signal region, and a laser path disposed between the first signal region and the second signal region, a first light-shielding sheet disposed on the first signal region, and covered with a first indium tin oxide layer, and a second light-shielding sheet disposed on the second signal region, and covered with a second indium tin oxide layer, wherein the first signal region receives signals through the first indium tin oxide layer, and the second signal region receives signals through the second indium tin oxide layer, therefore improving the problem of signal transmission delay caused by the regional signal impedance difference of the indium tin oxide layer.

DESCRIPTION OF SPECIFIC EMBODIMENTS OF THE INVENTION

Figure 1:
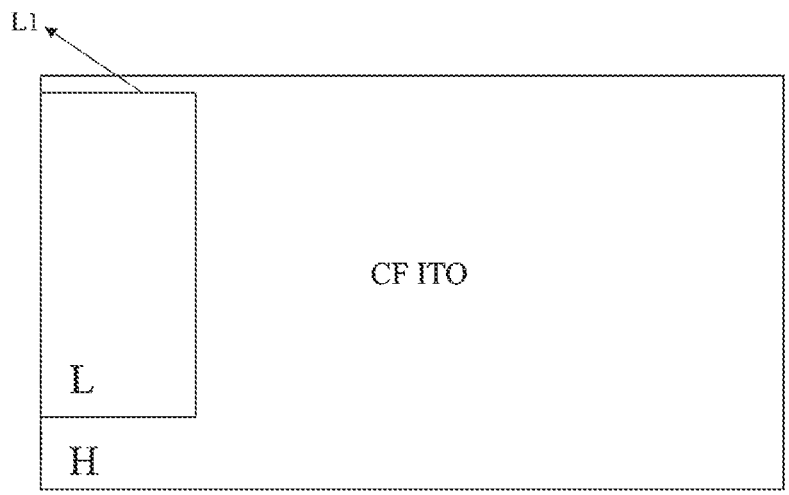
FIG. 1 shows a schematic diagram of lasering an indium tin oxide layer on a prior art color filter.
Figure 2:
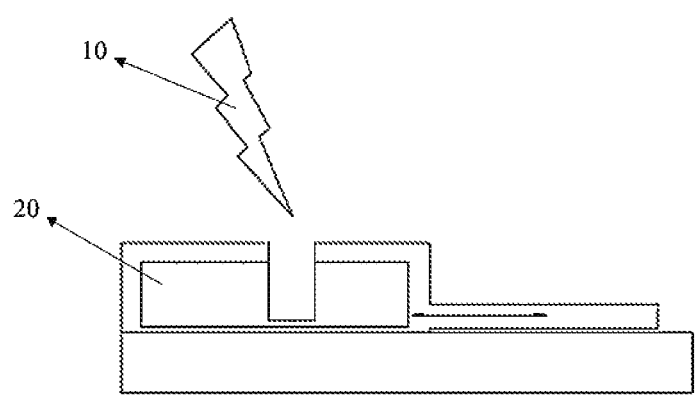
FIG. 2 shows a schematic diagram of laser damaging a light shielding film.

The following descriptions of the embodiments are made regarding additional figures to illustrate specific implemented embodiments of the present disclosure. The directional terms mentioned in the present disclosure, such as up, down, front, rear, left, right, in, out, side, etc., are only for reference to the direction of the attached figure. Therefore, the directional terms are used for explaining and understanding the present disclosure, not to limit it.

In the figure, similarly structured units are denoted by the same reference numerals.

In order to solve the above problems, the present disclosure provides a color filter, a manufacturing method thereof, and a display device to improve the problem of signal transmission delay caused by the regional signal impedance difference of the indium tin oxide layer.

Figure 3:
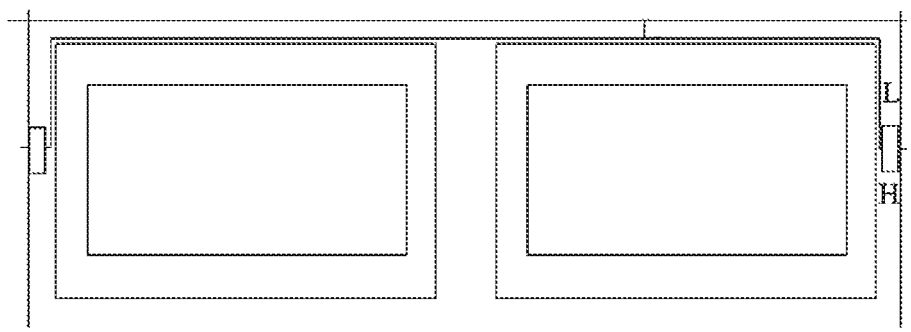
FIG. 3 shows a top view of the prior art color filter.
Figure 4:
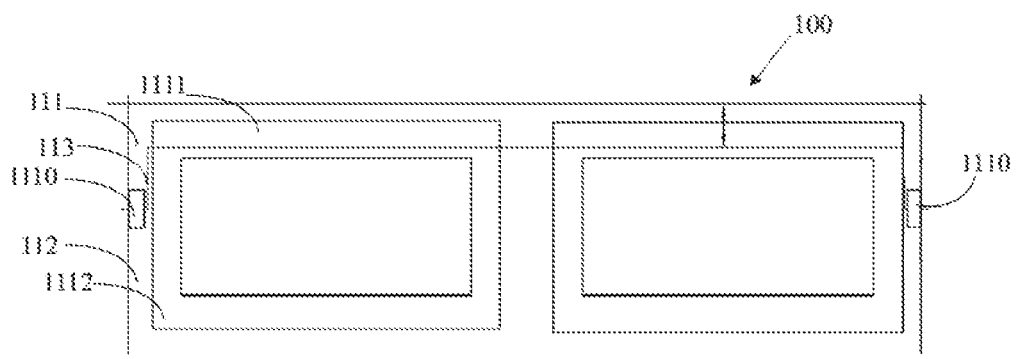
FIG. 4 shows a top view of a color filter according to an embodiment of the present disclosure.

Please refer to FIG. 4, which shows a top view of a color filter according to an embodiment of the present disclosure. The present disclosure provides a color filter 100 including a color filter substrate; a plurality of sub-pixel regions disposed on the color filter substrate, wherein each of the sub-pixel regions includes a first signal region 111, a second signal region 112, and a laser path 113 disposed between the first signal region 111 and a second signal region 112; a first light-shielding sheet 1111 disposed on the first signal region 111 and covered with a first indium tin oxide layer, and a second light-shielding sheet 1112 disposed on the second signal region 112 and covered with a second indium tin oxide layer; wherein the first signal region 111 receives signals through the first indium tin oxide layer, and the second signal region 112 receives signals through the second indium tin oxide layer. Through the above-mentioned settings, compared with the high electrical potential signal ITO region H and the low electrical potential signal ITO region L disclosed in FIG. 3, the present disclosure provides the first signal region 111 and the second signal region 112 of the color filter with less area difference, which further improves the signal delay problem caused by the difference in the area signal impedance of the first signal region 111 and the second signal region 112. At the same time, with the design of the laser path 113 to prevent the light-shielding film from damage caused by lasering the light-shielding film and this reduces the electrical influence on the indium tin oxide layer.

The first signal region 111 and the second signal region 112 are respectively connected to the signal source 1110. In FIG. 4, the signal source 1110 is marked between the first signal region 111 and the second signal region 112 to indicate the signal source. However, the present disclosure is not limited to this, and the signal source 1110 may also be disposed at other positions between the non-first signal region 111 and the second signal region 112, for example, outside the color filter 100.

A path width of the laser path is determined according to the accuracy of the laser and the length of the resonant cavity. For example, in an embodiment of the present disclosure, a path width of the laser path 113 is greater than 450 μm.

In an embodiment of the present disclosure, a region of the first light-shielding sheet 1111 is less than a region of the second light-shielding sheet 1112, the first signal region 111 receives a low-voltage signal through the first indium tin oxide layer, and the second signal region 112 receives a high-voltage signal through the second indium tin oxide layer. In other words, a region with a smaller light shielding region is a low signal region, and a region with a larger light shielding region is a high signal region.

Alternatively, in an embodiment of the present disclosure, a region of the first signal region 111 is less than a region of the second signal region 112, the first signal region 111 receives a low-voltage signal through the first indium tin oxide layer, and the second signal region 112 receives a high-voltage signal through the second indium tin oxide layer. In other words, a region with a smaller region is a low signal region, and a region with a larger region is a high signal region.

Figure 5:
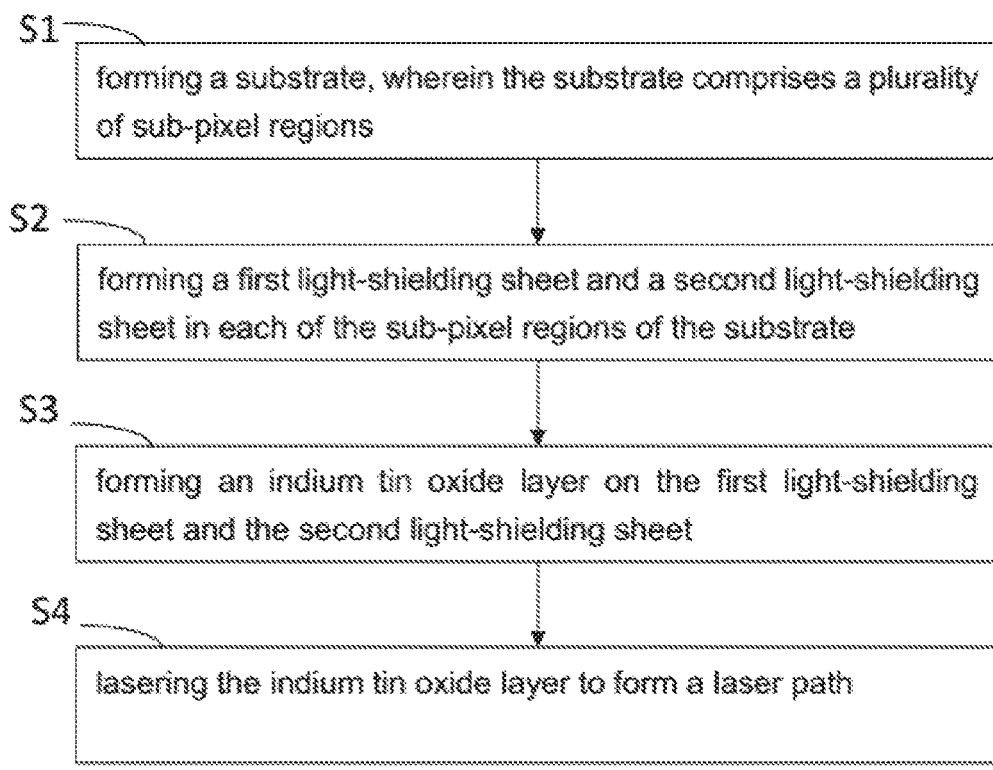
FIG. 5 shows a flowchart of a method of manufacturing a color filter according to an embodiment of the disclosure.

Please refer to FIG. 5. FIG. 5 shows a flowchart of a method of manufacturing a color filter according to an embodiment of the disclosure, including:

Step S1: forming a substrate, wherein the substrate comprises a plurality of sub-pixel regions;

Step S2: forming a first light-shielding sheet and a second light-shielding sheet in each of the sub-pixel regions of the substrate;

Step S3: forming an indium tin oxide layer on the first light-shielding sheet and the second light-shielding sheet; and Step S4: lasering the indium tin oxide layer to form a laser path;

wherein the laser path separates the indium tin oxide layer into a first indium tin oxide layer covering the first light-shielding sheet, and a second indium tin oxide layer covering the second light-shielding sheet; and separating the sub-pixel region into a first signal region including the first light-shielding sheet and first indium tin oxide layer, and a second signal region including the second light-shielding sheet and the second indium tin oxide layer.

Figure 6:
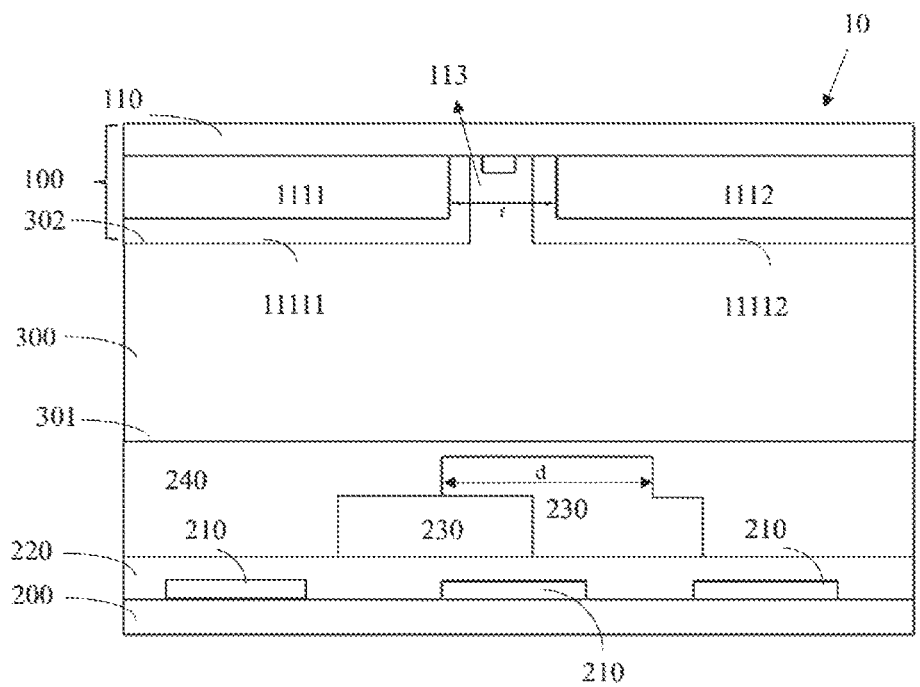
FIG. 6 shows a cross-sectional view of a display device according to an embodiment of the present disclosure.

Referring to FIG. 6, the present disclosure further provides a display device 10 including a first substrate 200, a plurality of metal layers 210 disposed on the first substrate 200, a passivation layer 220 disposed to cover the first substrate 200 and the plurality of metal layers 210, a plurality of color resists 230 disposed on the passivation layer 220, and a planarization layer 240 covering the plurality of color resists 230 and the passivation layer 220. The metal layer 210 can be used for light shielding.

Please refer to FIG. 4 and FIG. 6 together, the display device 10 further includes the color filter 100 as described above, which is disposed on the other side opposite to the first substrate 200 and includes the color filter substrate 110; a plurality of sub-pixel regions disposed below the color filter substrate 110, wherein each of the sub-pixel regions comprises a first signal region 111 and a second signal region 112, and a laser path 113 disposed between the first signal region 111 and the second signal region 112; a first light-shielding sheet 1111 disposed on the first signal region 111 and covered with a first indium tin oxide layer 11111; a second light-shielding sheet 1112 disposed on the second signal region 112, and covered with a second indium tin oxide layer 11112, and a spacer layer 300 including a first surface 301 and a second surface 302, wherein the first surface 301 contacts the planarization layer 240, and the second surface 302 contacts the first indium tin oxide layer 11111 and the second indium tin oxide layer 11112, the first signal region 111 receives signals through the first indium tin oxide layer 11111, and the second signal region 112 receives signals through the second indium tin oxide layer 11112. The positions of the plurality of color resists 230 are disposed and aligned below the position of the laser path 113.

In an embodiment of the present disclosure, the first substrate 200 and the color filter substrate 110 are glass substrate.

In an embodiment of the present disclosure, the planarization layer 240 is made of an organic material.

In one embodiment of the present disclosure, the planarization layer 240 is made of a polymer film.

In an embodiment of the present disclosure, a path width of the laser path 113 is greater than 450 μm.

In an embodiment of the present disclosure, a path width of the laser path 113 is greater than 450 μm, but is not greater than 2 times an applied laser accuracy.

In an embodiment of the present disclosure, a distance f between the first light-shielding sheet 1111 and the second light-shielding sheet 1112 of the laser path 113 is greater than 450 um.

In an embodiment of the present disclosure, a distance f between the first light-shielding sheet 1111 and the second light-shielding sheet 1112 of the laser path 113 is greater than 450 um, and is not greater than 2 times an applied laser accuracy.

In an embodiment of the present disclosure, a plurality of color resists 230 are stacked on the passivation layer 220, and a width d of the overlapping portion of the plurality of color resists 230 is greater than the width of the laser path 113.

In an embodiment of the present disclosure, the plurality of color resists 230 are stacked on the passivation layer 220, and a width d of the overlapping portion of the plurality of color resists 230 is greater than a distance f between the first light-shielding sheet 1111 and the second light-shielding sheet 1112 adjacent to the laser path 113.

Because the present disclosure provides a color filter and a manufacturing method thereof, and a display device, wherein the color filter including a color filter substrate, a plurality of sub-pixel regions, wherein each of the sub-pixel regions includes a first signal region, a second signal region, and a laser path disposed between the first signal region and the second signal region, a first light-shielding sheet disposed on the first signal region, and covered with a first indium tin oxide layer; and a second light-shielding sheet disposed on the second signal region, and covered with a second indium tin oxide layer, wherein the first signal region receives signals through the first indium tin oxide layer, and the second signal region receives signals through the second indium tin oxide layer, therefore improving the problem of signal transmission delay caused by the regional signal impedance difference of the indium tin oxide layer.

The above are only the preferred embodiments of the present disclosure. It should be noted that for those of ordinary skill in the art, without departing from the principles of the present disclosure, several improvements and retouches can be made. These improvements and retouches should also be considered in the protected range of the present disclosure.

What is claimed is:

1. A color filter, comprising:
a color filter substrate;
a plurality of sub-pixel regions disposed on the color filter substrate, wherein each of the sub-pixel regions comprises a first signal region, a second signal region, and a laser path disposed between the first signal region and the second signal region;
a first light-shielding sheet disposed on the first signal region, and covered with a first indium tin oxide layer; and
a second light-shielding sheet disposed on the second signal region, and covered with a second indium tin oxide layer;
wherein the first signal region receives signals through the first indium tin oxide layer, and the second signal region receives signals through the second indium tin oxide layer;
wherein a path width of the laser path is greater than 450 μm.

2. The color filter as claimed in claim 1, wherein a region of the first light-shielding sheet is less than a region of the second light-shielding sheet, the first signal region receives a low-voltage signal through the first indium tin oxide layer, and the second signal region receives a high-voltage signal through the second indium tin oxide layer.

3. The color filter as claimed in claim 1, wherein a region of the first signal region is less than a region of the second signal region, the first signal region receives a low-voltage signal through the first indium tin oxide layer, and the second signal region receives a high-voltage signal through the second indium tin oxide layer.

4. A method of manufacturing a color filter, comprising:
forming a substrate, wherein the substrate comprises a plurality of sub-pixel regions;
forming a first light-shielding sheet and a second light-shielding sheet in each of the sub-pixel regions of the substrate;
forming an indium tin oxide layer on the first light-shielding sheet and the second light-shielding sheet; and
lasering the indium tin oxide layer to form a laser path;
wherein the laser path separates the indium tin oxide layer into a first indium tin oxide layer covering the first light-shielding sheet, and a second indium tin oxide layer covering the second light-shielding sheet; and separates the sub-pixel region into a first signal region comprising the first light-shielding sheet and first indium tin oxide layer, and a second signal region comprising the second light-shielding sheet and the second indium tin oxide layer; and
wherein a path width of the laser path is greater than 450 µm.

5. The method of manufacturing the color filter as claimed in claim 4, wherein a region of the first light-shielding sheet is less than a region of the second light-shielding sheet, the first signal region receives a low-voltage signal through the first indium tin oxide layer, and the second signal region receives a high-voltage signal through the second indium tin oxide layer.

6. The method of manufacturing the color filter as claimed in claim 4, wherein a region of the first signal region is less than a region of the second signal region, the first signal region receives a low-voltage signal through the first indium tin oxide layer, and the second signal region receives a high-voltage signal through the second indium tin oxide layer.

7. A display device, comprising:
a first substrate
a plurality of metal layers disposed on the first substrate;
a passivation layer covering the first substrate and the plurality of metal layers;
a plurality of color resists disposed on the passivation layer;
a planarization layer covering the plurality of color resists and the passivation layer;
the color filter as claimed in claim 1, disposed on another side opposite to the first substrate of the display device; and
a spacer layer comprising a first surface and a second surface, wherein the first surface contacts the planarization layer, and the second surface contacts the first indium tin oxide layer and the second indium tin oxide layer;
wherein disposing positions of the plurality of color resists are aligned below a disposing position of the laser path.

8. The display device as claimed in claim 7, wherein a path width of the laser path is greater than 450 µm.

9. The display device as claimed in claim 7, wherein the plurality of color resists are stacked on the passivation layer, and a width of an overlapping portion of the plurality of color resists is greater than a width of the laser path.

10. The display device as claimed in claim 7, wherein a region of the first light-shielding sheet is less than a region of the second light-shielding sheet, the first signal region receives a low-voltage signal through the first indium tin oxide layer, and the second signal region receives a high-voltage signal through the second indium tin oxide layer.

11. The display device as claimed in claim 7, wherein a region of the first signal region is less than a region of the second signal region, the first signal region receives a low-voltage signal through the first indium tin oxide layer, and the second signal region receives a high-voltage signal through the second indium tin oxide layer.

12. The display device as claimed in claim 7, wherein the first substrate and the color filter substrate are glass substrates.

13. The display device as claimed in claim 7, wherein a distance between the first light-shielding sheet and the second light-shielding sheet of the laser path is greater than 450 µm, and is not greater than 2 times an applied laser accuracy.

14. The display device as claimed in claim 7, wherein the plurality of color resists are stacked on the passivation layer, and
a width of the overlapping portion of the plurality of color resists is greater than a distance between the first light-shielding sheet and the second light-shielding sheet of the laser path.

* * * * *